United States Patent [19]

Jubran

[11] Patent Number: 5,490,102

[45] Date of Patent: Feb. 6, 1996

[54] LOW CAPACITANCE CONTENT-ADDRESSABLE MEMORY CELL

[75] Inventor: Farah Jubran, Haifa, Israel

[73] Assignee: Intel Corporation, Santa Clara, Calif.

[21] Appl. No.: 260,044

[22] Filed: Jun. 15, 1994

[51] Int. Cl.[6] .................................................. G11C 15/00
[52] U.S. Cl. ........................................ 365/49; 365/189.07
[58] Field of Search ................................ 365/49, 189.07, 365/154, 204

[56] References Cited

U.S. PATENT DOCUMENTS

| 4,538,243 | 8/1985 | Zehner ........................................ 365/49 |
| 5,034,919 | 7/1991 | Sasai et al. ................................. 365/49 |
| 5,327,372 | 7/1994 | Oka et al. ................................... 365/49 |
| 5,351,208 | 9/1994 | Jiang ............................................ 365/49 |

FOREIGN PATENT DOCUMENTS

| 0293595 | 12/1987 | Japan ........................................ 365/49 |
| 403278398 | 12/1991 | Japan ........................................ 365/49 |

*Primary Examiner*—David C. Nelms
*Assistant Examiner*—Son Dinh
*Attorney, Agent, or Firm*—Blakely, Sokoloff, Taylor & Zafman

[57] ABSTRACT

A content addressable memory (CAM) comprising an array of CAM cells is disclosed. Each CAM cell includes a memory cell and a compare circuit that writes the memory cell from the bit lines if the word line is active and that compares memory cell data with an input data bit on the bit lines if the word line is inactive.

6 Claims, 4 Drawing Sheets

LOW CAPACITANCE CONTENT-ADDRESSABLE MEMORY CELL

BACKGROUND OF THE INVENTION

1. Field of the Invention

The present invention pertains to the field of integrated circuit devices. More particularly, this invention relates to a low capacitance memory cell for a fully associative content-addressable memory array.

2. Background

A typical content addressable memory (CAM) comprises an array of CAM cells. Each CAM cell in the array usually includes a static random access memory (SRAM) cell and comparator circuitry. The comparator circuitry of a CAM cell typically performs comparison between data stored in the SRAM cell and input data received over a corresponding set of bit lines. Each CAM cell is typically coupled to a match line. Typically, the comparator circuitry of the CAM cell generates a match signal on the match line if the input data on the bit lines matches the data stored in the CAM cell.

The CAM cells of a typical CAM array are arranged into a matrix of rows and columns. The CAM array usually includes a match line for each row of the CAM array. Each column of the CAM array typically shares a set of bit lines.

During a CAM look-up operation, each CAM cell in the CAM array that detects a mismatch discharges the match line row. The discharged voltage on the match line indicates a CAM mismatch for that row of the CAM array. Any one CAM cell in a row of the CAM array can indicate a mismatch for the entire row by discharging the corresponding match line.

FIG. 1 illustrates a prior CAM cell 10. The CAM cell 10 includes an SRAM cell comprising a pair of transistors Q2 and Q3 and a pair of inverters 20 and 22. The comparator circuitry of the CAM cell 10 comprises a set of transistors Q4–Q7. The transistors Q4 and Q5 and the transistors Q6 and Q7 are arranged as pass gates. The transistors Q4 and Q5 are a pass gate for input data received over a bit line 12. The transistors Q6 and Q7 are a pass gate for input data received over a bit line 14.

During a CAM look-up operation, if a mismatch occurs between the data received over the bit lines 12 and 14 and the data stored in the SRAM cell then the pass gate of the transistors Q4 and Q5 or the pass gate of the transistors Q6 and Q7 drive a node 24 to a voltage high. The high voltage at the node 24 switches on transistor Q1 which is the discharge transistor for a match line 18. The transistor Q1 then discharges the voltage on the match line 18 to indicate a failed CAM match.

The CAM cell 10 presents a high input capacitance at the bit lines 12 and 14. The input capacitance at the bit line 12 includes the diffusion capacitance's of the transistors Q4 and Q5. The input capacitance at the bit line 14 includes the diffusion capacitance of the transistors Q6 and Q7. In addition, if either of the pass gates of the transistors Q4 and Q5 or the transistors Q6 and Q7 is switched on, then the input capacitance at the bit line 12 or 14 also includes the gate capacitance at the transistor Q1 and the capacitance of charging the channels of the pass gate (Q6, Q7) which is equivalent to a gate capacitance of both transistors (Q6, Q7). Such high capacitance at the bit lines 12 and 14 increases the loading for circuitry that drives the bit lines 12 and 14 and slows down the CAM look-up operation.

FIG. 2 illustrates another prior CAM cell 30. The CAM cell 30 includes an SRAM cell comprising a pair of transistors Q10 and Q11 and a pair of inverters 40 and 42. The comparison and discharge functions for the CAM cell 30 are performed by a set of transistors Q12–Q15. The transistors Q12 and Q13 are serial transistors coupled to a match line 38. Similarly, the transistors Q14 and Q15 are serially coupled to the match line 38.

During a CAM look-up operation, if a mismatch occurs between the data received over a set of bit lines 32 and 34 and the data stored in the SRAM cell, then either the serial transistors Q12 and Q13 or the serial transistors Q14 and Q15 switch on and discharge the match line 38.

In this case, the match line 38 is heavily loaded. If the transistor Q12 is switched on, then the match line 38 is loaded by the diffusion of the drain of the transistor Q14, the diffusions of the source and the drain of the transistor Q12, the diffusion of the drain of the transistor Q13, and the channel of the transistor Q12 which is equivalent to a gate capacitance of the transistor Q12. Such a load is relatively large in comparison to the discharge strength of the CAM cell 30 provided by two serial transistors.

Furthermore, the high output capacitance for the CAM cell 30 is duplicated in all CAM cells along a row of such a prior CAM array. Such a high capacitive loading of the match line 38 limits the switching speed during a CAM look-up operation. The limited switching speed effectively imposes an upper limit on the number of CAM cells that may be placed along a row of such a prior CAM array, thereby limiting the bit width of the CAM.

SUMMARY AND OBJECTS OF THE INVENTION

One object of the present invention is to provide a content addressable memory cell that provides a low input capacitance to the corresponding bit lines.

Another object of the present invention is to provide a content addressable memory cell that provides a low output capacitance to the corresponding match line.

Another object of the present invention is to provide a relatively deep content addressable memory array by providing individual content addressable memory cells having a low input capacitance.

Another object of the present invention is to provide a relatively wide content addressable memory array by providing individual content addressable memory cells having a low output capacitance.

These and other objects of the invention are provided by a content addressable memory cell having a memory cell for storing a data bit. The content addressable memory cell includes a compare circuit coupled to a pair of bit lines and a word line for the content addressable memory cell. The compare circuit writes the data bit from the bit lines if the word line is active. The compare circuit compares the data bit with an input data bit on the bit lines if the word line is inactive. The content addressable memory cell includes a discharge transistor coupled to the compare circuit. The discharge transistor discharges the match line if the compare circuit senses a mismatch between the data bit and the input data bit.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
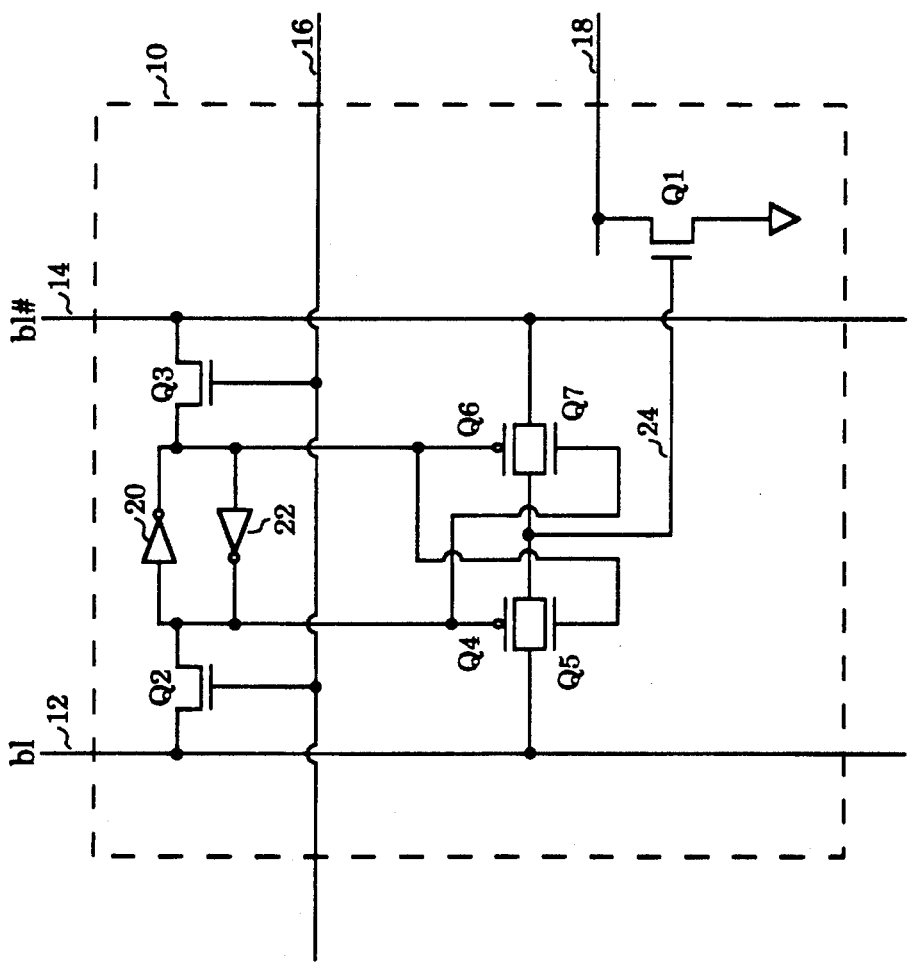
FIG. 1 illustrates a prior CAM cell which includes an SRAM cell comprising a pair of transistors and a pair of inverters, and which also includes comparator circuitry.
Figure 2:
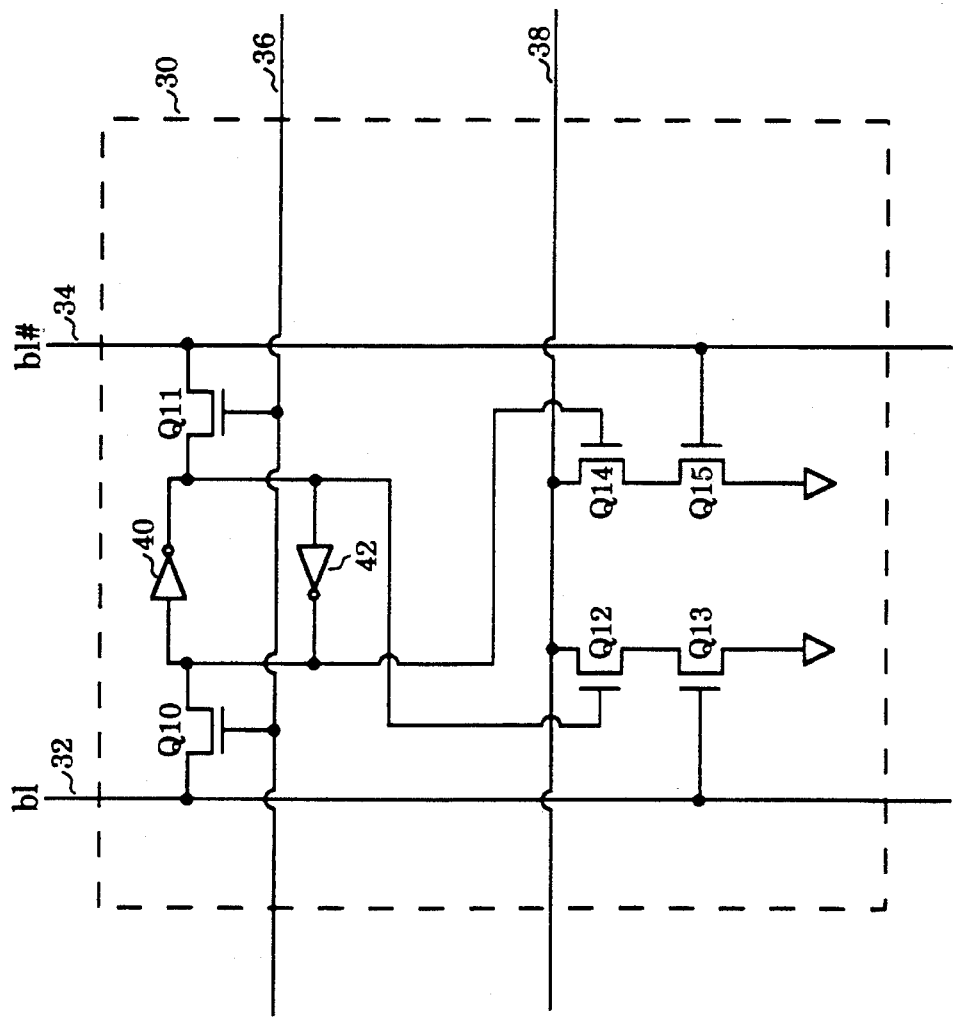
FIG. 2 illustrates another prior CAM cell which includes an SRAM cell comprising a pair of transistors and a pair of inverters.
Figure 3:
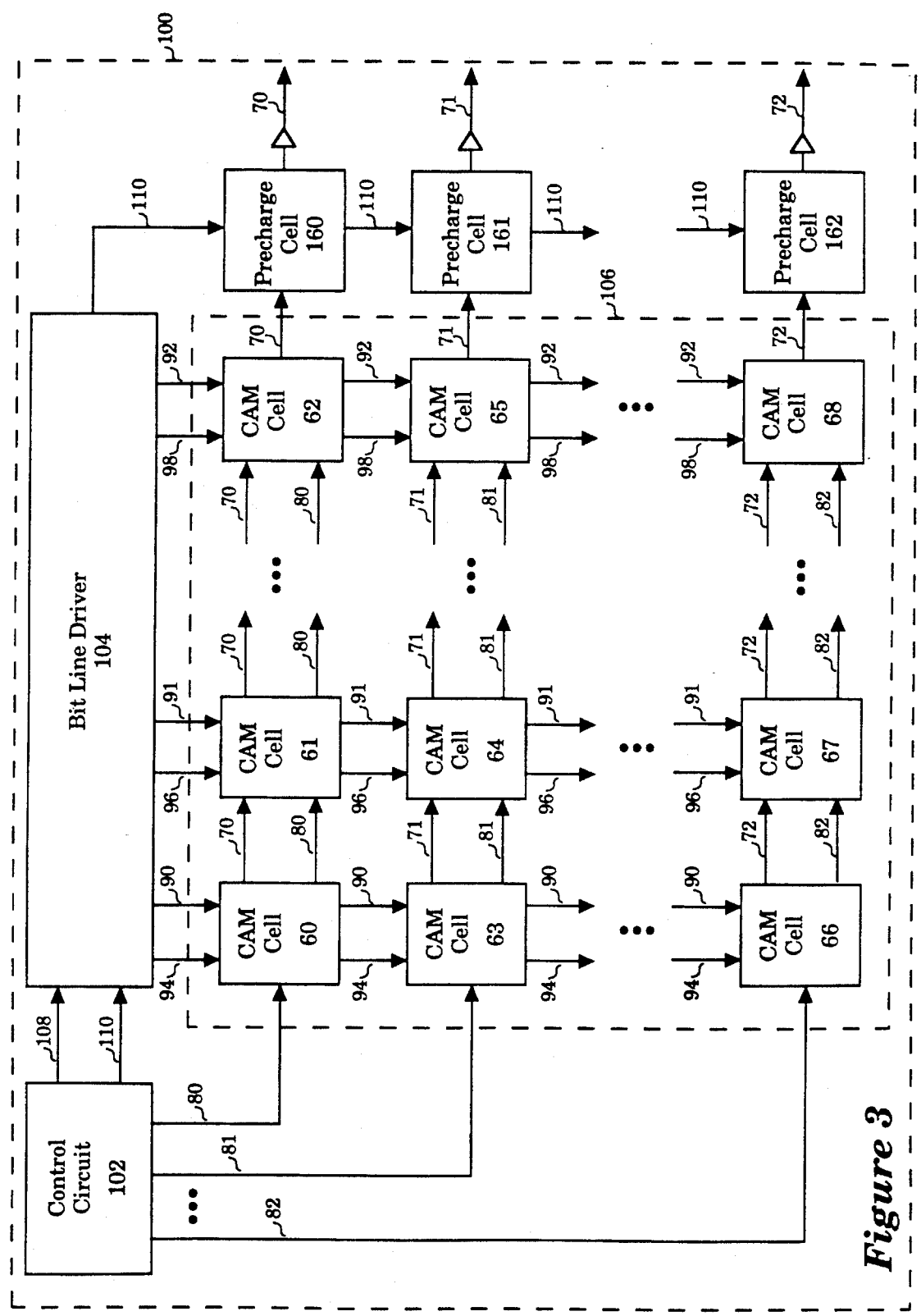
FIG. 3 illustrates a content-addressable memory for one embodiment which comprises a control circuit, a bit line driver circuit, a CAM cell array, and a set of precharge circuits or cells.

FIG. 3 illustrates a content-addressable memory 100 for one embodiment. The content-addressable memory 100 comprises a control circuit 102, a bit line driver circuit 104, and a CAM cell array 106. The CAM cell array 106 comprises a set of CAM cells 60–68.

The control circuit 102 drives a set of word lines 80–82 for the CAM cell array 106. The control circuit 102 drives the appropriate word lines 80–82 to perform write operations to the CAM cells 60–68. In addition, the control circuit 102 drives the appropriate word lines 80–82 to perform CAM look-up or match operations to the CAM cells 60–68.

The bit line driver circuit 104 drives a set of bit lines 90–92 for the CAM cell array 106. The bit line driver circuit 104 drives data on the bit lines 90–92 during write operations. The bit line driver circuit 104 also drives CAM lookup data on the bit lines 90–92 during CAM look-up operations. The bit line driver 104 drives low voltage to both bit lines of each column when neither a lookup nor a write operation is being executed and when the match lines 70–72 are being precharged.

In addition, the bit line driver circuit 104 drives a set of enable lines 94–98 for the CAM cell array 106. The enable lines 94–98 are employed to enable/disable the match compare function along columns of the CAM cell array 106 during a CAM look-up operation by driving low voltage to bit lines and keeping the CAM in match state. The enable lines 94–98 are also employed during precharge operations on the match lines 70–72. The precharge cells 160–162 precharge the match lines 70–72 to a high voltage to prepare for lookup.

The control circuit 102 transfers a set of CAM look-up data 108 to the bit line driver circuit 104. The CAM look-up data 108 provides the data driven over the bit lines 90–92 during CAM look-up operations. The control circuit 102 also provides a look-up control signal 110 to the bit line driver circuit 104. The look-up control signal 110 controls CAM look-up operations and precharge operation to the CAM cell array 106.

Each word line 80–82 corresponds to a row of the CAM cell array 106. For example, the word line 80 provides a word line for a row comprising the CAM cells 60–62. Similarly, the word line 81 provides a word line for a row comprising the CAM cells 63–65 and the word line 82 provides a word line for a row comprising the CAM cells 66–68.

Each set of bit lines 90–92 provides a pair of bit lines for a column of the CAM cell array 106. For example, the bit lines 90 are coupled to a column comprising the CAM cells 60, 63, and 66. The bit lines 91 are coupled to a column comprising the CAM cells 61, 64, and 67. Similarly, the bit lines 92 are coupled to a column comprising the CAM cells 62, 65, and 68.

Each enable line 94–98 corresponds to a column of the CAM cell array 106. For example, the enable line 94 is coupled to the column of the CAM cell array 106 comprising the CAM cells 60, 63, and 66. Similarly, the enable line 96 is coupled to a column comprising the CAM cells 61, 64, and 67, and the enable line 98 is coupled to a column comprising the CAM cells 62, 65, and 68.

Each match line 70–72 is coupled to the CAM cells of a corresponding row of the CAM cell array 106 and to the precharge cells 160–162. The match line 70 is coupled to the row comprising the CAM cells 60–62 and to the precharge cell 160. Similarly, the match line 71 is coupled to the row comprising the CAM cells 63–65 and to the precharge cell 161, and the match line 72 is coupled to the row comprising the CAM cells 66–68 and to the precharge cell 162.

During a write operation to the CAM cell array 106, the bit line driver circuit 104 drives the write data onto the bit lines 90–92. The control circuit 102 also drives one of the word lines 80–82 to select a row of the CAM cell array 106 for the write operation.

The bit line driver circuit 104 receives the CAM look-up data 108 from the control circuit 102 for a CAM look-up operation to the CAM cell array 106. The look-up control signal 110 from the control circuit 102 causes the bit line driver circuit 104 to perform the CAM look-up operation. The look-up control signal 110 causes the bit line driver circuit 104 to drive the CAM look-up data 108 onto the bit lines 90–92 and causes the precharge cells 160–162 to stop precharge. The control circuit 102 keeps the word lines 80–82 deactivated and activates them just in a write operation.

During the CAM look-up operation, each of the CAM cells 60–68 that detect a mismatch to the data on the corresponding bit lines 90–92 discharges the corresponding match lines 70–72. For example, if the CAM cell 60 detects a mismatch between the data on the bit lines 90 and the data stored internally, then the CAM cell 60 discharges the match line 70. The resulting high to low voltage transition on the match line 70 indicates a CAM mismatch on the corresponding row of the CAM cell array 106.

Figure 4:
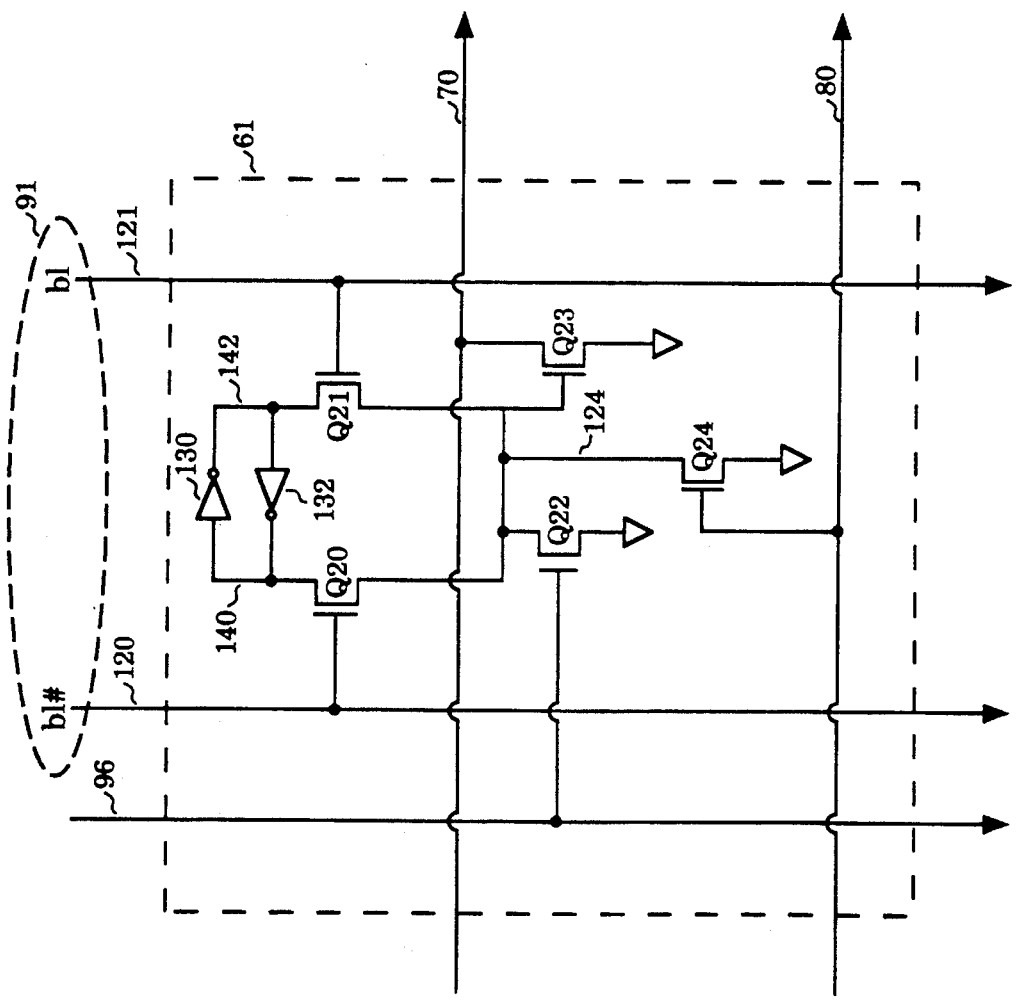
FIG. 4 illustrates a CAM cell for one embodiment which includes a memory cell and a compare circuit comprising a pair of transistors.

FIG. 4 illustrates the CAM cell 61 for one embodiment. The CAM cells 60, and 62–68 are the same as the CAM cell 61. The CAM cell 61 includes a memory cell comprising a pair of inverters 130 and 132. The CAM cell 61 further comprises a pair of transistors Q20 and Q21. The transistors Q20 and Q21 are employed during write operations to the CAM cell 61 and during CAM look-up operations to the CAM cell 61.

The CAM cell 61 further comprises a set of transistors Q22–Q24. The transistor Q23 is a discharge transistor coupled to the match line 70. The transistor Q22 enables and disables the compare function of the CAM cell 61. The gate of the transistor Q22 is coupled to the enable line 96. The transistor Q24 selects between a CAM lookup operation or a write operation in the CAM cell 61. The gate of the transistor Q24 is coupled to the word line 80.

The CAM cell 61 receives input data over the bit lines 91. The bit lines 91 comprise a bit line (b1) 120 and an inverted bit line (b1#) 121. The bit line driver circuit 104 drives the bit lines 120 and 121 such that the voltages on the bit lines 120 and 121 are complementary during write operations and CAM look-up operations to the CAM cell 61 and to a low voltage otherwise.

Data is written into the CAM cell 61 over the bit lines 120 and 121 through the transistors Q20 and Q21. The transistors Q20 and Q21 also perform comparison functions between the data stored in the memory cell of the CAM cell 61 and the data driven on the bit lines 120 and 121.

During a write operation to the CAM cell 61, the bit line driver circuit 104 drives the input data over the bit lines 120 and 121. The control circuit 102 then activates the word line 80 to a high voltage. The high voltage on the word line 80 switches on the transistor Q24. The transistor Q24 pulls down the voltage at a node 124. As a consequence, either the transistor Q20 or the transistor Q21 transfers the low voltage at the node 124 into the memory cell of the CAM cell 61.

If the bit line driver circuit 104 drives a high voltage on the bit line 120 and a low voltage on the bit line 121 then the transistor Q20 transfers the low voltage on the node 124 into the memory cell. Conversely, if the bit line driver circuit 104 drives a high voltage on the bit line 121 and a low voltage on the bit line 120 then the transistor Q21 transfers the low voltage at the node 124 into the memory cell.

During a CAM look-up operation to the CAM cell 61, the bit line driver circuit 104 drives the corresponding CAM look-up data bit onto the bit lines 120 and 122. The control circuit 102 maintains a low voltage on the word line 80 during the CAM look-up operation. If the data on the bit lines 120 and 121 matches the data in the memory cell at the nodes 140 and 142 then one of the transistors Q20 or Q21 switches on and maintains the low voltage at the node 124. The low voltage at the node 124 indicates a match.

A low voltage at the node 124 during the CAM look-up operation indicates a match and a high voltage at the node 124 indicates a mismatch. The CAM look-up data on the bit lines 120 and 121 switches on either the transistor Q20 or the transistor Q21 because the bit lines 120 and 121 are complementary during the CAM look-up operation.

During the CAM look-up operation, the high voltage at the node 124 resulting from a mismatch switches on the discharge transistor Q23. The discharge transistor Q23 then discharges the voltage on the match line 70.

On the other hand, the low voltage at the node 124 resulting from a match keeps the discharge transistor Q23 switched off. The switched off discharge transistor Q23 prevents the CAM cell 61 from discharging the match line 70.

The transistor Q22 is employed during a precharge of the match line 70 to prevent an inadvertent discharge. During the precharge operation, the bit line driver circuit 104 maintains a low voltage on the bit lines 120 and 121. The low voltages on the bit lines 120 and 121 switch off the transistors Q20 and Q21. As a consequence, the voltage at the node 124 floats. The bit line driver circuit 104 activates the enable line 96 to a high voltage. The high voltage at the enable line 96 switches on the transistor Q22 and pulls down the voltage at the node 124. The transistor Q22 prevents the node 124 from floating high and switching on the transistor Q23. A high voltage on the node 124 during a precharge phase of the match line 70 would cause the transistor Q23 to discharge the match line 70.

The transistor Q22 is also employed to disable the comparison function in the CAM cell 61 during a CAM look-up operation. The bit line driver circuit 104 activates the enable line 96 to a high voltage and the bit lines 120–121 to a low voltage to prevent the CAM cell 61 from contributing to the CAM look-up operation. The high voltage on the enable line 96 switches on the transistor Q22 and prevents the node 124 from switching on the discharge transistor Q23.

The CAM cell 61 presents a relatively low input capacitance to the bit lines 120 and 121. The input capacitance at the bit line 120 is the gate capacitance of the transistor Q20. Similarly, the input capacitance at the bit line 121 is the gate capacitance of the transistor Q21.

The CAM cell 61 also presents a relatively low output capacitance at the match line 70. The output capacitance for the CAM cell 61 at the match line 70 is the diffusion capacitance of the transistor Q23. The relatively low output capacitance on the match line 70 enables coupling of a relatively large number of CAM cells to the match line 70. As a consequence, the CAM cell array 106 provides relatively fast switching speeds with a wide CAM cell array.

The transistors that make up the inverters 130 and 132 are strong enough to drive the gate of the transistor Q23 if a mismatch occurs during a comparison function. In addition, the transistors of the inverters 130 and 132 are weak enough to be driven through the transistors Q20 and Q21 during a write operation. Write operations to the CAM cell 61 are performed by forcing a match indication at the node 124.

For one embodiment, the inverter 130 and 132 each comprise a P type transistor having a gate length to width ratio of 5/1 and an N type transistor having a gate length to width ratio of 1.5/0.7 for a 0.7 micron process. The P type inverter pull-up transistor is strong enough to perform fast switching of the gate of the discharge transistor Q23 if a mismatch occurs.

For one embodiment, the comparison transistors Q20 and Q21 each have a gate length to width ratio of 3/0.7, and the discharge transistor Q23 has a gate length to width ratio of 9/0.7. The transistor Q23 is large enough to discharge up to 70 CAM cells coupled to the match line 70.

For one embodiment, the transistor Q24 has a gate length to width ratio of 6/0.7. The transistor Q24 controls write operations to the CAM cell 61 and is large enough to drive the pull-up transistors of the inverters 130 and 132.

For one embodiment, the transistor Q22 has a gate length to width ratio of 1.3/0.7. The size of the transistor Q22 is minimized in order to minimize the area required for implementing the CAM cell 61.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A content addressable memory cell, comprising:

memory cell for storing a data bit;

compare circuit coupled to a pair of bit lines and a word line, the compare circuit coupled to write the data bit from the bit lines if the word line is active, the compare circuit coupled to compare the data bit with an input data bit on the bit lines if the word line is inactive;

discharge transistor including a gate coupled to the compare circuit at a match node such that the compare circuit switches on the discharge transistor if the data bit mismatches the input data bit, the discharge transistor coupled to discharge the match line if the compare circuit senses a mismatch between the data bit and the input data bit;

write control transistor coupled to the match node and to the word line, the write control transistor switching off the discharge transistor if the word line is active;

disable circuit coupled to the match node and coupled to a disable line for the memory cell, the disable circuit disabling the compare circuit according to a signal on the disable line.

2. The content addressable memory cell of claim 1, wherein the disable circuit disables the compare circuit by discharging the match node when both bit lines are low.

3. A content addressable memory, comprising an array of content addressable memory (cam) cells for storing an array of data bits, each cam cell comprising a compare circuit coupled to write a corresponding data bit in the array from a set of bit lines if a word line is active, the compare circuit coupled to compare the corresponding data bit with an input data bit on the bit lines if the word line is inactive, each cam cell further comprising a discharge transistor coupled to discharge the match line if the compare circuit senses a mismatch between the data bit and the input data bit wherein a gate of the discharge transistor is coupled to the compare circuit at a match node to switch on the discharge transistor if the data bit mismatches the input data bit, the content addressable memory further comprising a write control transistor coupled to the match node and to the word line, the write control transistor switching off the discharge transistor if the word line is active and a disable circuit coupled to the match node and coupled to a disable line for the memory cell, the disable circuit disabling the compare circuit according to a signal on the disable line.

4. The content addressable memory of claim 3, wherein the disable circuit disables the compare circuit by discharging the match node when both bit lines are low.

5. A method for accessing a memory cell, comprising the steps of:

writing a data bit from a set of bit lines for the memory cell if a word line for the memory cell is active;

comparing the data bit with an input data bit on the bit lines if the word line is inactive including the step of comparing the data bit with the input data bit on the bit lines while the word line is inactive;

discharging a match line if the data bit mismatches the input data bit including the step of switching on a discharge transistor coupled to the match line if the data bit mismatches the input data bit;

switching off the discharge transistor if the word line is active;

disabling the comparing step according to a signal on an enable line for the memory cell.

6. The method of claim 5, wherein the step of disabling the comparing step according to a signal on an enable line for the memory cell comprises the step of discharging the match node when both bit lines are low.

* * * * *